US010367142B2

(12) United States Patent
Lee et al.

(10) Patent No.: US 10,367,142 B2
(45) Date of Patent: Jul. 30, 2019

(54) LAYERED STRUCTURE FOR AN OLED AND A METHOD FOR PRODUCING SUCH A STRUCTURE

(71) Applicant: SAINT-GOBAIN GLASS FRANCE, Courbevoie (FR)

(72) Inventors: Young Seong Lee, Seoul (KR); Simon Le Moal, Shanghai (CN); Jinwoo Han, Seoul (KR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/566,447

(22) PCT Filed: Mar. 23, 2016

(86) PCT No.: PCT/EP2016/056448
§ 371 (c)(1),
(2) Date: Oct. 13, 2017

(87) PCT Pub. No.: WO2016/165921
PCT Pub. Date: Oct. 20, 2016

(65) Prior Publication Data
US 2018/0114910 A1  Apr. 26, 2018

(30) Foreign Application Priority Data

Apr. 16, 2015 (EP) .................................. 15163911

(51) Int. Cl.
*H01L 51/00* (2006.01)
*H01L 51/52* (2006.01)
(52) U.S. Cl.
CPC ...... *H01L 51/0023* (2013.01); *H01L 51/0096* (2013.01); *H01L 51/5212* (2013.01);
(Continued)

(58) Field of Classification Search
CPC ................................................... H01L 51/0023
(Continued)

(56) References Cited

U.S. PATENT DOCUMENTS

2012/0178196 A1*  7/2012  Park ................... H01L 27/1288
                                                          438/34
2014/0014939 A1*  1/2014  Sakaguchi .......... H01L 51/5253
                                                          257/40

FOREIGN PATENT DOCUMENTS

EP    2 178 343 A1    4/2010
FR    3 020 179 A1    10/2015
(Continued)

OTHER PUBLICATIONS

International Search Report as issued in International Patent Application No. PCT/EP2016/056448, dated Jul. 26, 2016.
(Continued)

*Primary Examiner* — Stanley Tso
(74) *Attorney, Agent, or Firm* — Pillsbury Winthrop Shaw Pittman LLP

(57) ABSTRACT

A layered structure suitable as a support for an organic light emitting device (OLED), includes a light-transmissive glass substrate, a diffusive internal extraction layer (IEL) with an outer layer made of a glass containing at least 30 weight % of $Bi_2O_3$, formed on one side of the light-transmissive glass substrate, and an acid-resistant barrier layer formed on the IEL. The acid-resistant barrier layer has a bilayer structure made of an ALD-deposited metal oxide layer, the metal oxide being selected from the group consisting of aluminum oxide ($Al_2O_3$), titanium oxide ($TiO_2$), zirconium oxide ($ZrO_2$) and hafnium oxide ($HfO_2$), in contact with the IEL, and a sputter-deposited $SiO_xN_y$ layer in contact with the ALD-deposited metal oxide layer.

14 Claims, 2 Drawing Sheets

Figure 1A:
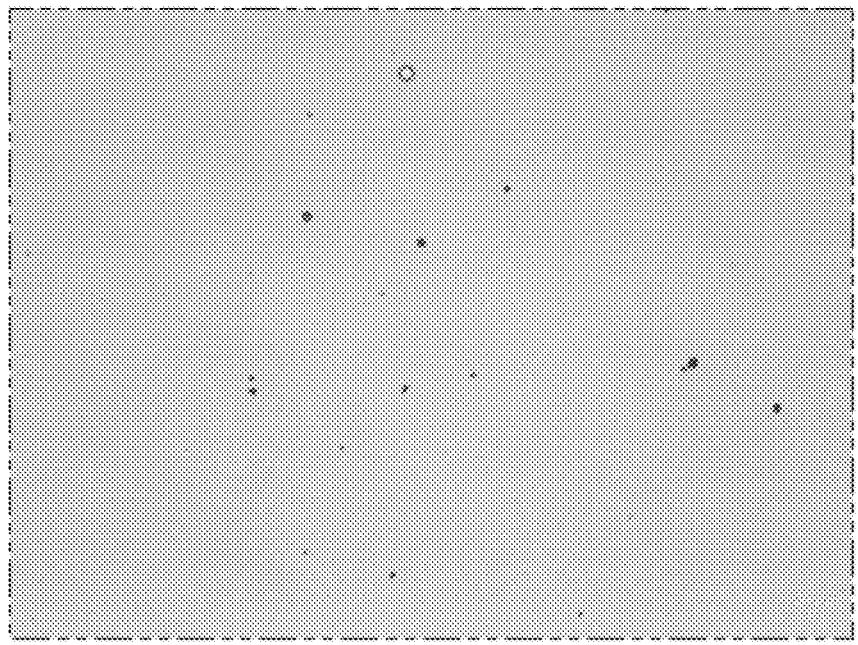

(52) U.S. Cl.
CPC ...... *H01L 51/5253* (2013.01); *H01L 51/5268* (2013.01); *H01L 51/5206* (2013.01); *H01L 2251/308* (2013.01)

(58) Field of Classification Search
USPC ........................................................ 174/258
See application file for complete search history.

(56) References Cited

FOREIGN PATENT DOCUMENTS

| WO | WO 2011/089343 A1 | 7/2011 | | |
|---|---|---|---|---|
| WO | WO2012/093467 | * | 7/2012 | ............. H01L 51/50 |
| WO | WO 2012/093467 A1 | 7/2012 | | |
| WO | WO2013/187735 | * | 12/2013 | ............. H01L 51/54 |
| WO | WO 2013/187735 | * | 12/2013 | |
| WO | WO 2013/187735 A1 | 12/2013 | | |
| WO | WO2014/013183 | * | 1/2014 | ............. H01L 51/52 |
| WO | WO 2014/013183 | * | 1/2014 | |
| WO | WO 2014/013183 A1 | 1/2014 | | |
| WO | WO 2014/048927 A1 | 4/2014 | | |

OTHER PUBLICATIONS

Leskelä, M., et al., "Atomic layer deposition (ALD): from precursors to thin film structures." Thin Solid Films, 409 (2002) pp. 138-146.

George, S. M., "Atomic Layer Deposition: An Overview," Chem. Rev. (2010), 110, pp. 111-131.

* cited by examiner

LAYERED STRUCTURE FOR AN OLED AND A METHOD FOR PRODUCING SUCH A STRUCTURE

CROSS-REFERENCE TO RELATED APPLICATIONS

This application is the U.S. National Stage of PCT/EP2016/056448, filed Mar. 23, 2016, which in turn claims priority to European patent application number 15163911.9 filed Apr. 16, 2015. The content of these applications are incorporated herein by reference in their entireties.

The present invention is drawn to a layered structure suitable as a light-scattering substrate for organic light emitting devices (OLEDs) and to a method for producing such a layered structure.

OLEDs are opto-electronic elements comprising a stack of organic layers with fluorescent or phosphorescent dyes sandwiched between two electrodes, at least one of which is translucent. When a voltage is applied to the electrodes the electrons injected from the cathode and the holes injected from the anode recombine within the organic layers, resulting in light emission from the fluorescent/phosphorescent layers.

It is commonly known that light extraction from conventional OLEDs is rather poor, most of the light being trapped by total internal reflection in the high index organic layers and transparent conductive layers (TCL). Total internal reflection takes place not only at the boundary separating the high index TCL from the underlying glass substrate (refractive index of about 1.5) but also at the boundary between the glass and air.

According to estimates, in conventional OLEDs not comprising any additional light-extraction layer about 60% of the light emitted from the organic layers is trapped at the TCL/glass boundary, an additional 20% fraction is trapped at the glass/air surface and only about 20% exit the OLED into air.

It is known to reduce this problem by means of a light scattering layer between the TCL and the glass substrate. Such light scattering layers have a high refractive index close to the TCL index and contain a plurality of light-scattering elements.

It is also known to increase out-coupling of light by texturing the interface between the glass and the high index layers of the OLED.

Both of these light extraction means, also commonly called "internal extraction layers" (IEL), comprise asperities that need to be planarized before applying the TCL or the organic stack.

The Applicant has developed an IEL technology which involves a $Bi_2O_3$-based planarization layer deposited by fusion of screen-printed glass frit. This layer must have perfect surface quality in the lighting area or in the vicinity of the lighting area in order to avoid any leakage current or electrical shortcut in the organic stack.

Between the IEL and the organic layers composing the OLED module, a transparent anode is deposited in order to drive the current through the whole surface of the organic layers. This anode is typically composed of either a single layer of ITO (indium tin oxide) or, in some cases, a layer of ITO combined with a metal grid which contributes to significantly reduce the overall resistivity of the anode. The use of a metal grid is mostly required in the case of large size OLED panels, but in practice it is also sometimes used by panel makers even for relatively small OLED panels.

The ITO layer typically has a thickness of 100-180 nm and is deposited by vacuum sputtering. The metal grid is typically a three layered structure made of a Mo—Al—Mo ("MAM") structure, also deposited by vacuum sputtering process, with typical total thickness of about 700 nm (100 nm Mo/500 nm Al/100 nm Mo).

After deposition of ITO and metal coatings on the IEL planarization layer by vacuum sputtering, the two following patterning steps are conducted:
  Patterning of the metal layer : large surfaces of metal are removed from the active area of the OLED, leaving only the grid structure,
  Patterning of the ITO layer: lines of ITO are removed at the edge of the active area in order to block the electrical connections between the anode and the cathode contact pads which are also designed on the ITO coating near—but outside—the active area.

The patterning of the ITO and metal layers is typically performed by photolithography and wet etching process.

When the metal grid is formed under the ITO layer, patterning of the metal layer must of course be carried out prior to the sputtering of the ITO layer.

Wet etching of the TCO coating may require very strong acidic solutions, typically a mix of $Fe_3Cl/HCl/H_2O$ or $HNO_3/HCl/H_2O$ is currently used when the TCO is indium-tin oxide (ITO), the most common material used for that purpose.

The metal layers may be etched with milder acidic solutions; typically a mixture of $H_3PO_4/HNO_3/CH_3COOH/H_2O$ is used.

Because of its high bismuth content, the high index glass of the top layer (planarization layer) of the internal extraction layer has very poor chemical resistance against these acidic solutions used for the wet etching of ITO and metal layers. Therefore, if for any reason those etching solutions come into contact with the top surface of the internal extraction layer during the patterning process, they will penetrate into the IEL and cause important damage, for example craters up to 100 μm large, which will impact severely the reliability of the final OLED panel (short-circuit/high leakage current/device failure).

In order to prevent this issue, a thin barrier coating may be deposited on top of IEL to prevent contact between the etching solutions and the IEL top surface.

In WO2013/187735 a barrier layer of sputtered $SiO_2$ or $Si_3N_4$ having a thickness of about 5-50 nm is formed on top of the internal extraction layer, i.e. between the internal extraction layer and the conductive electrode layer.

Figure 2:
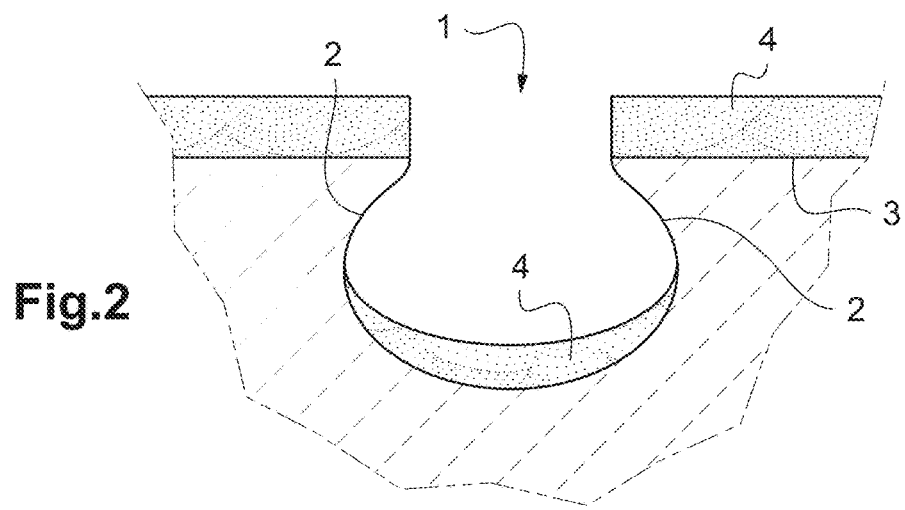

Such vacuum sputtered barrier layers however are not fully satisfactory for the following reason:

When the IEL top layer surface has surface defects, such as solidified open bubbles with vertical or negative slopes, the directionality of the sputtering process leaves small zones, located in the "shadow" of the protruding elements, uncovered and unprotected. FIG. 2 is a schematic representation of this problem. When acidic etching solutions come into contact with such a small, poorly protected surface defect, a larger crater will be etched in the underlying IEL.

FIG. 1 is a photograph of a glass substrate covered with a high bismuth glass layer, sputtered with a SiON barrier layer and then exposed to strong acid such as diluted aqua regia: a lot of pits are generated as a result of chemical attack at the weak-points of the barrier layer.

In the not yet published French application 1453584 filed on Apr. 22, 2014 the Applicant tried to address this specific problem by replacing the vacuum sputtered barrier layer by a metal oxide layer formed by atomic layer deposition (ALD). Atomic layer deposition is advantageous over sputtering in that it results in very dense, tight, continuous and perfectly conformal surface layers. There are no "shadow" zones, such as those illustrated in FIG. 2.

Typical material used for ALD barrier coating is $Al_2O_3$, deposited with a thickness of about 10 to 30 nm.

Although the ALD coating has the desired conformal property needed to protect the weak points at the IEL surface defects, a single $Al_2O_3$ layer is not always able to completely resist acid etching, in particular ITO etching with strong acids. Deposition of multiple ALD layers ($Al_2O_3$ alternated with other metal oxides such as $TiO_2$, $ZrO_2$ and $HfO_2$) is proposed in FR 1453584, but such multiple ALD layers require very long deposition times.

Moreover, single or multiple ALD layers may comprise pinholes due to small dust particles lying on the IEL prior to and during the ALD coating. Such pinholes would not be avoided by multiple ALD coating steps made in the same deposition machine without any washing step between the coatings.

The acid barrier layer of the present invention resisting to acid wet etching is a combination of an ALD layer and of a sputter-deposited SiON layer, the deposition steps of these two layers being separated by a washing step.

The top surface of the internal extraction layer is first coated by atomic layer deposition with a metal oxide layer. This ALD layer preferably is a single $Al_2O_3$ layer. The metal oxide-coated substrate is then submitted to a washing step. In this washing step, dust particles that were present on the internal extraction layer before the ALD step are eliminated and pinholes resulting therefrom are exposed. In spite of the small pinholes, the ALD layer perfectly covers the IEL at the surface defects resulting for example from solidified open bubbles. Indeed, pinholes due to dust particles are randomly distributed and the probability of having a dust particle create a pinhole in the "shadow" zones of IEL surface defects is extremely low.

The washed ALD layer is then covered in a subsequent step by a vacuum-sputtered SiON layer. Such a sputtered layer is not perfectly conformal and does not cover the "shadow" zones at the surface defects, but it will perfectly cover the pinholes of the underlying ALD layer.

The combined acid-resistant barrier layer of the present invention which is resistant to acid wet etching thus has a bilayer structure:
  a first ALD-deposited metal oxide layer perfectly matching the surface relief and surface defects of the underlying outer layer of the IEL, but possibly containing some pinholes,
  a second sputter-deposited SiON layer covering the pinholes of the underlying ALD-deposited metal oxide layer, but possibly not perfectly matching the deeper surface defects of the IEL.

The Applicant had further observed that insertion of a metal oxide layer between the high bismuth IEL and the SiON barrier layer described in WO2013/187735 resulted in an additional unexpected advantage: it substantially reduced the extra 0.5% light absorption resulting from sputtering SiON onto high bismuth IEL that the Applicant had empirically but clearly observed without being able to identify the mechanism leading to it.

A first subject-matter of the present invention consequently is a layered structure suitable as a support for an organic light emitting device (OLED), said layered structure comprising:

(i) A light-transmissive glass substrate,
(ii) A diffusive internal extraction layer (IEL) with an outer layer made of a glass containing at least 30 weight % of $Bi_2O_3$, formed on one side of the light-transmissive glass substrate, and
(iii) An acid-resistant barrier layer formed on the IEL, said acid-resistant barrier layer having a bilayer structure made of an
  ALD-deposited metal oxide layer, the metal oxide being selected from the group consisting of aluminum oxide ($Al_2O_3$), titanium oxide ($TiO_2$), zirconium oxide ($ZrO_2$) and hafnium oxide ($HfO_2$), in contact with the IEL, and
  a sputter-deposited $SiO_xN_y$ layer in contact with the ALD-deposited metal oxide layer.

Another subject-matter of the present invention is a method for producing a layered structure as defined above, said method comprising the following successive steps:
(a) Providing a light-transmissive glass substrate with a diffusive internal extraction layer (IEL) formed on one side of the light-transmissive substrate, the outer layer of said IEL being made of a glass containing at least 30 weight % of $Bi_2O_3$,
(b) Depositing by atomic layer deposition (ALD) on the surface of the IEL a layer of a metal oxide selected from the group consisting of aluminum oxide ($Al_2O_3$), titanium oxide ($TiO_2$), zirconium oxide ($ZrO_2$) and hafnium oxide ($HfO_2$), preferably $Al_2O_3$,
(c) Washing the resulting ALD-coated substrate,
(d) Depositing by sputtering a $SiO_xN_y$ layer on the ALD-coated washed substrate.

The glass of the light-transmissive glass substrate is an inorganic glass such as an alkali glass, alkali-free glass, high strain point glass, quartz glass, etc. Its refractive index (at 550 nm) is typically comprised between 1.5 and 1.6.

A diffusive, i.e. light-scattering, internal extraction layer is formed on the glass substrate. As explained above, the internal extraction layer formed on one side of the light-transmissive substrate is a layer provided to prevent light, which is generated in the light emitting organic layers of the OLED, from being lost by total internal reflection.

The internal extraction layer is made of a high index glass material formed by applying a frit paste to one side of the light-transmissive substrate and firing the resulting substrate. The internal extraction layer may comprise scattering elements such as pores or solid particles selected from the group consisting of $SiO_2$, $TiO_2$ and $ZrO_2$ particles. The light scattering effect may also be provided by a suitable surface roughness of the underlying glass substrate planarized with a high index glass layer, such as described for example in WO2014/048927 in the name of the Applicant.

The top layer, or planarization layer, of the internal extraction layer of the present invention is made of a glass containing at least 30 weight % of $Bi_2O_3$. The high $Bi_2O_3$ content provides the internal extraction layer with a high refraction index, typically between 1.8 and 2.0, but also strongly reduces its chemical resistance against acids.

The glass of the internal extraction layer preferably comprises at least 50 wt % and more preferable at least 60 wt % of $Bi_2O_3$.

The planarization layer is preferably applied by screen printing, spray coating, bar coating, roll coating, slot die coating and possibly spin coating, of an aqueous or organic suspension of glass particles. A description of suitable high index glass frits and methods for coating and firing them can be found for example in EP 2 178 343.

The glass frit should be selected to have a melting point comprised between 450° C. and 570° C. and should lead to an enamel having a refractive index of 1.7 to 2.2.

Preferred glass frits have the following composition:
$B_2O_3$: 55-75 wt %
BaO: 0-20 wt %
ZnO: 0-20 wt %
$Al_2O_3$: 1-7 wt %
$SiO_2$: 5-15 wt %
$B_2O_3$: 5-20 wt %
$Na_2O$: 0.1-1 wt %
$CeO_2$: 0-0.1 wt %

In a typical embodiment, the glass frit particles (70-80 wt %) are mixed with 20-30 wt % of an organic vehicle (ethyl cellulose and organic solvent). The resulting frit paste is then applied onto the textured glass substrate by screen printing or slot coating. The resulting layer is dried by heating at a temperature of 120-200° C. The organic binder (ethyl cellulose) is burned out at a temperature of between 350-440° C., and the firing step resulting in the final enamel is carried out at a temperature of 450° C. to 570° C.

The resulting high index enamels have been shown to have a surface roughness with an arithmetical mean deviation $R_a$ (ISO 4287) of less than 0.5 nm when measured by AFM on an area of 10 μm×10 μm.

As explained in the introductory part, the planarization layer however may suffer from surface defects, such as open air bubbles solidified during the cooling of the fired glass frit, which would be insufficiently protected against subsequent acid etching by a sputtered SiON.

The light-transmissive substrate carrying the internal extraction layer with an outer layer made of a glass containing at least 30 weight % of $Bi_2O_3$, is then submitted to formation of an acid-resistant double layer comprising a first metal oxide layer coated by atomic layer deposition and a second layer of silicon oxinitride deposited by vacuum sputtering.

Atomic layer deposition is a rather young but well-known technique for coating substrates with perfectly conformal thin metal oxide layers (see for example Markku Leskelä et al. «Atomic layer deposition (ALD): from precursors to thin film structures», Thin solid film, 409 (2002) 138-146, and Steven M. George "Atomic Layer Deposition: An Overview, Chem. Rev. 2010, 110, 111-131).

A gaseous precursor adsorbs on the substrate as a monolayer. After evacuation of the deposition chamber, a second gaseous compound is made to react with the adsorbed first component.

The metal oxide of the ALD layer is selected from the group consisting of aluminum oxide ($Al_2O_3$), titanium oxide ($TiO_2$), zirconium oxide ($ZrO_2$) and hafnium oxide ($HfO_2$). These metal oxides can be deposited from the following precursors and reactives.

| Metal oxide | precursor | reactive |
| --- | --- | --- |
| $Al_2O_3$ | trimethylaluminium | $H_2O$, $O_3$, $O_2$, plasma |
| $TiO_2$ | tetraisopropoxide | |
| $ZrO_2$ | tetrakis-dimethylaminozirconium | |
| $HfO_2$ | tetrakis-ethylmethylamino-hafnium | |

$Al_2O_3$ is preferred for its high deposition speed.

The metal oxide is advantageously deposited as a layer having a thickness comprised between 5 and 100 nm, preferably between 10 and 50 nm.

After the atomic layer deposition, the substrate is submitted to a washing step. This washing step is essential to the present invention: dust particles that may have been present on the IEL layer before ALD coating are eliminated, thereby exposing pinholes in the thin conformal ALD layer.

The washing advantageously comprises immersing the substrate into an aqueous neutral detergent solution. This first step is advantageously carried out under ultrasonic radiation. The substrate is then dipped for a few minutes into a series of rinsing baths containing pure water, generally at room temperature. Here again, the rinsing is advantageously operated with ultrasonic stimulation.

A rinsing step in warm water can be advantageously implemented after the room temperature rinsing steps.

The washed and rinsed substrate may be dried at room temperature or preferably by a flow of warm filtered air.

Alternatively the different washing steps may be implemented in a washing machine with brushes (instead of ultrasound) coming into contact with the coated substrates, preferably in horizontal position.

The ALD-coated, washed and dried substrate is then submitted to reactive vacuum sputtering of a $SiO_xN_y$ layer. The term "$SiO_xN_y$ layer" includes silica ($SiO_2$) layers and stoichiometric silicon nitride ($Si_3N_4$) layers and any layer having an intermediate composition.

The $SiO_xN_y$ layer preferably has a refractive index (at λ=550 nm) comprised between 1.8 and 2.0, more preferably between 1.9 and 2.0.

Its thickness is preferably comprised between 5 and 200 nm, more preferably between 10 and 100 nm.

The four-layered structure comprising the light-transmissive glass substrate, the IEL, the ALD metal oxide layer and the sputtered $SiO_xN_y$ layer then receives a transparent electrode layer.

As explained in the introductory part of this application, this transparent electrode layer may be a simple transparent conductive oxide (TCO) layer or it may comprise a TCO layer in combination with a metal grid. To effectively reduce the resistivity of the transparent electrode layer, the metal grid must be in contact with the TCO layer.

The metal grid may be formed under the TCO layer. In that case, a metal layer is first coated onto the $SiO_xN_y$ layer. It is then patterned by photolithography and wet-etching using rather mild acidic solution, typically a mixture of $H_3PO_4/HNO_3/CH_3COOH/H_2O$, and finally coated with the TCO layer.

In another embodiment, the metal grid is not under but on the TCO layer. In that case the $SiO_xN_y$ layer is first coated with the TCO layer, which is then coated with the metal layer. This six-layer structure (substrate/IEL/ALD metal oxide layer/TCO/metal layer) is perfectly stable and may be sold to OLED panel makers who can proceed with the TCO and metal patterning according to their own desired designs.

Transparent conductive layers suitable as anodes for OLEDs are well known in the prior art. The most commonly used material is ITO (Indium Tin Oxide). The transparent conductive layer should have a light transmission of at least 80%, and a refractive index of between 1.7 and 2.2. Its total thickness is typically comprised between 50 and 200 nm.

The metal layer and metal grid preferably have a three-layer structure such as Mo—Al—Mo or a two-layer structure such as Al—Mo, the high reflective Al layer facing the IEL. In another embodiment, described in WO2014/013183, a thin Al or Ag coating is added on the side of the metal grid facing the IEL.

Figure 3:
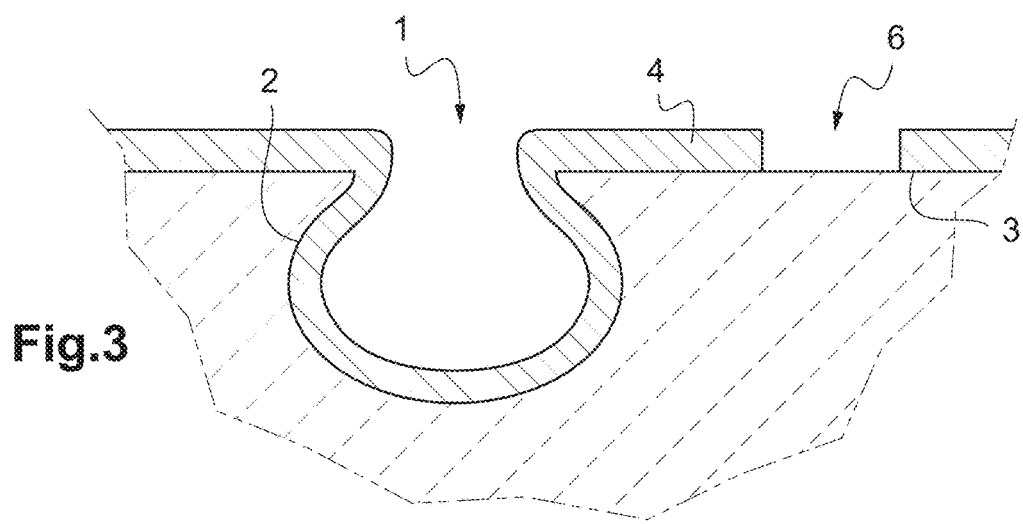
Figure 4:
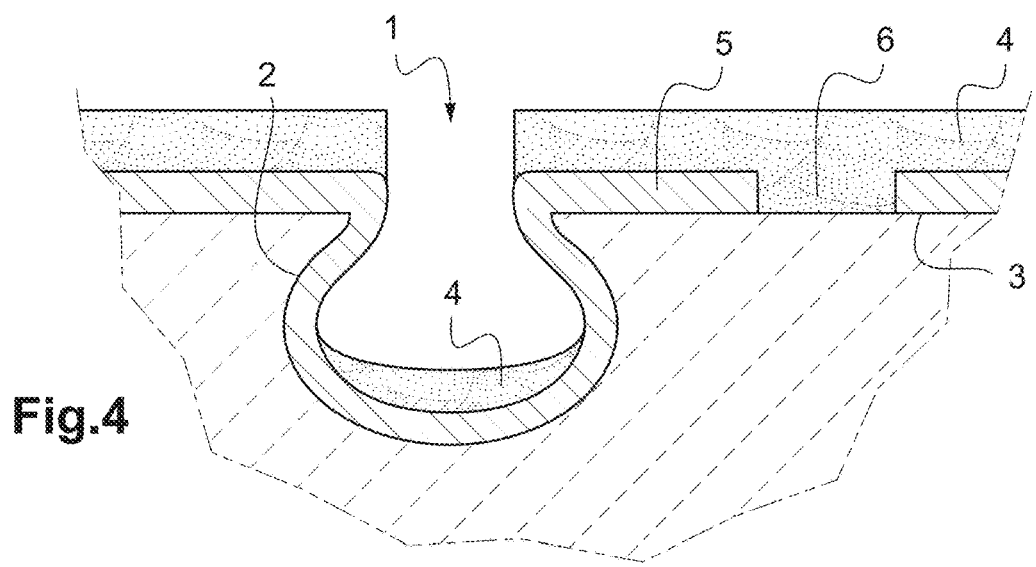

The features and benefits of the present invention will become more apparent by describing in detail exemplary embodiments thereof with reference to the attached drawings in which FIG. 1 is a photograph of the surface defects visible after acid etching of a glass substrate covered with a high bismuth glass layer and vacuum sputtered with a simple SiON barrier, FIG. 2 is a schematic representation of a vacuum sputtered layer deposited on the top surface of a planarization layer FIG. 3 is a schematic representation of a metal oxide layer deposited by atomic layer deposition (ALD) on the top surface of the same planarization layer as in FIG. 2, FIG. 4 is a schematic representation of the acid resistant bilayer of the present invention deposited by ALD and vacuum sputtering on the top surface of the same planarization layer as in FIGS. 2 and 3, FIG. 1a and b illustrate the technical problem underlying the present invention. Internal extraction layers based on glass having a high $Bi_2O_3$ content are known to be easily digested by strong acids used for wet etching of transparent conductive oxides and metal grids. Magnetron sputtered SiON layers are therefore provided on such IEL as barrier layers for protection against subsequent acid etching of the TCO of the electrode layer. However, when such a $Bi_2O_3$-rich glass layer protected with a 100 nm thick sputtered SiON barrier layer is immerged for 3 minutes in concentrated strong acid (diluted aqua regia) at 40° C., surface defects become visible.

Figure 1B:
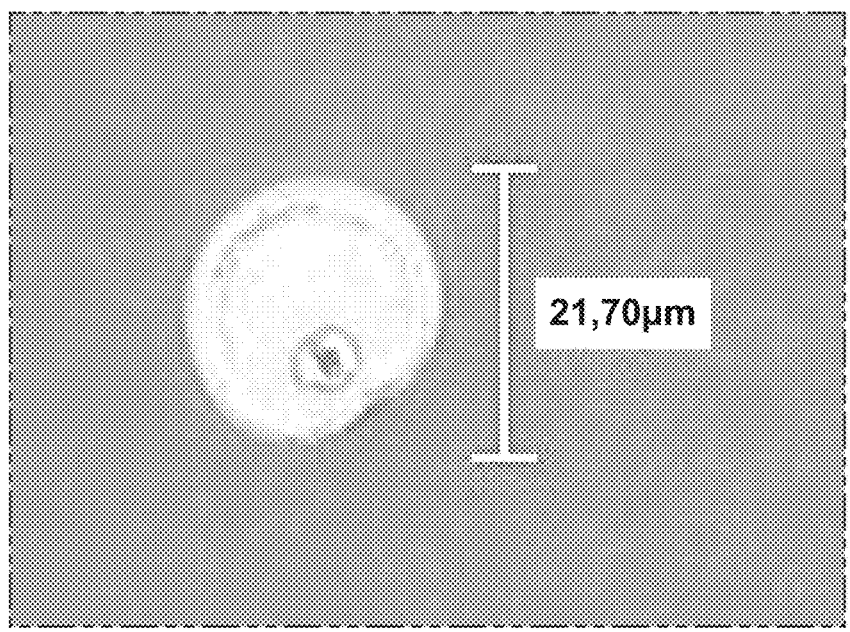

FIG. 1a shows such surface defects with a magnification of about ×50. FIG. 1b shows an individual surface defect with a much higher magnification of ×1000.

In the final OLED such surface defects may lead to short-cuts and leakage currents.

FIG. 2 shows a possible explanation of the permeability of the SiON layer. Vacuum sputtering is a directional deposition technique, i.e. most of the sputtered metal atoms and/or oxides extracted from the sputtering source hit the IEL's surface 3 with an angle close to 90°. When surface defects due to open air bubbles 1, solidified at the IEL surface before completely leveling out, are coated by sputtering, the metal atoms/oxides cannot reach each and every point of the surface relief and small zones 2 lying in the "shadow" of negative slopes will remain uncovered. These uncovered shadow zones are weak-points of the SiON barrier 4 where the etchant solution is directly in contact with the underlying IEL.

FIG. 3 shows a perfectly conformal, non-directionally coated barrier layer 5 on an open air bubble defect 1. It is known that such conformal coatings can be obtained by atomic layer deposition. They cover the shadow zones 2 and would be perfect barrier layers if they did not contain small pinholes 6 due to dust particles present on the surface of the IEL 3 before coating.

FIG. 4 shows the combined barrier layer of the present invention obtained by first coating the IEL 3 with a conformal ALD layer 5, then washing the ALD layer to eliminate possible dust particles and expose possible pinholes 6, and finally coating the washed ALD layer with a magnetron sputtered SiON layer 4. The weak-points of each layer where the etchant solution could previously leak through to the underlying IEL are thus covered and made leak-proof by the other layer.

EXAMPLES

Example (According to the Invention)

A 200×200×0.7 mm soda-lime glass sheet with an internal extraction layer (IEL) based on high bismuth glass is coated by atomic layer deposition (ALD) with a 30 nm thick $Al_2O_3$ layer.

The ALD-coated IEL is then submitted to the following standard washing procedure:
Immersion in a neutral detergent solution with ultrasonic radiation,
Immersion in a first bath of pure water at room temperature with ultrasonic radiation,
Immersion in a second bath of pure water at room temperature with ultrasonic radiation,
Immersion in a third bath of pure water at room temperature with ultrasonic radiation,
Immersion in a bath of warm water without ultrasonic radiation, and
Drying in a flow of filtered hot air.

The washed ALD-coated IEL is then coated by reactive vacuum sputtering (hot sputtering) first with an SiON layer having a thickness of 100 nm and then with a 120 nm thick ITO layer.

In the next step, the resulting layered structure is submitted to ITO patterning comprising the following steps:
Spin coating and baking of a 1.5 μm thick photoresist,
UV insolation of the photoresist through photolithography mask followed by development of the photoresist,
Wet etching by immersion into a standard strong acid ITO etchant containing HCl,
Stripping of the remaining photoresist The patterned samples are then inspected for surface defects using an in-house device working in reflection mode (Automatic Optical Inspection System). This AOI system measures the total number of defects (of at least 20 μm) per $cm^2$ on or near the surface. All defects detected by the AOI system are then reviewed by optical microcopy in order to distinguish etching damages (presence of bismuth salts) from surface defects due to contaminations and IEL defects that did not lead to etching damages on the surface.

Two comparative samples were prepared

Comparative Example 1(Without ALD Layer)

Washing of the soda-lime glass sheet carrying the high bismuth IEL by dipping in acetone bath with ultrasound, rinsing in water without ultrasound and drying.
Deposition of a 100 nm thick SiON layer by reactive sputtering directly onto the washed IEL and then sputtering of a 120 nm thick ITO layer. ITO patterning by photolithography and wet-etching as described above Comparative Example 2(Without Sputtered SiON Layer)

After ALD coating of the high bismuth IEL with a 30 nm thick $Al_2O_3$-layer, followed by the above standard washing procedure, the substrate is directly submitted to sputtering of the ITO layer (120 nm). ITO patterning by photolithography and wet-etching as described above The below Table shows the total number of surface defects detected by the Automatic Optical Inspection System and the etching damages on the IEL surface individually confirmed by optical microscopy of the AOI-detected defects.

| | Density of all defects detected by AOI (number/cm$^2$) | Density of etching damages on IEL surface confirmed by optical microscopy (number/cm$^2$) |
|---|---|---|
| Example according to the invention (substrate/IEL/Al$_2$O$_3$/SiON/ITO) | 0.57 | 0.02 |
| Comparative example 1 (substrate/IEL/SiON/ITO) | 0.38 | 0.07 |
| Comparative example 2 (substrate/IEL/Al$_2$O$_3$/ITO) | 0.60 | 0.11 |

It appears that the example according to the invention has significantly less etching damages than each of the comparative examples. The bilayer barrier formed by ALD and sputtering provides a more efficient protection of the underlying high bismuth IEL against acid etching.

The invention claimed is:

1. A layered structure suitable as a support for an organic light emitting device, said layered structure comprising:
   a light-transmissive glass substrate,
   a diffusive internal extraction layer with an outer layer made of a glass containing at least 30 weight % of Bi$_2$O$_3$, formed on one side of the light-transmissive glass substrate,
   an acid-resistant barrier layer formed on the diffusive internal extraction layer, said acid-resistant barrier layer having a bilayer structure made of an
      Atomic Layer Deposition (ALD) deposited metal oxide layer, the metal oxide being selected from the group consisting of aluminum oxide (Al$_2$O$_3$), titanium oxide (TiO$_2$), zirconium oxide (ZrO$_2$) and hafnium oxide (HfO$_2$), in direct contact with the diffusive internal extraction layer, and
      a sputter-deposited SiO$_x$N$_y$ layer in direct contact with the ALD-deposited metal oxide layer, and
   a transparent electrode layer on the acid-resistant barrier layer, the transparent electrode layer being provided in direct contact with the sputter-deposited SiO$_x$N$_y$ layer,
   wherein the transparent electrode layer comprises a transparent conductive oxide layer and a metal layer in contact with the transparent conductive oxide layer.

2. The layered structure according to claim 1, wherein the transparent electrode layer comprises a metal grid in contact with the transparent conductive oxide layer.

3. The layered structure according to claim 1, wherein the ALD-deposited metal oxide layer has a thickness comprised between 5 and 100 nm.

4. The layered structure according to claim 3, wherein the ALD-deposited metal oxide layer has a thickness comprised between 10 and 50 nm.

5. The layered structure according to claim 1, wherein the SiO$_x$N$_y$ layer has a thickness comprised between 5 and 200 nm.

6. The layered structure according to claim 5, wherein the SiO$_x$N$_y$ layer has a thickness comprised between 10 and 100 nm.

7. The layered structure according to claim 1, wherein the SiO$_x$N$_y$ layer has a refractive index (at 550 nm) of at least 1.8.

8. The layered structure according to claim 7, wherein the SiO$_x$N$_y$ layer has a refractive index (at 550 nm) of at least 1.9.

9. The layered structure according to claim 1, wherein the metal layer is a Mo—Al—Mo layer.

10. A method for producing a layered structure according to claim 1, said method comprising the following successive steps:
   (a) providing a light-transmissive glass substrate with a diffusive internal extraction layer formed on one side of the light-transmissive substrate, an outer layer of said diffusive internal extraction layer being made of a glass containing at least 30 weight % of Bi$_2$O$_3$,
   (b) depositing by atomic layer deposition (ALD) on a surface of the diffusive internal extraction layer a layer a metal oxide selected from the group consisting of aluminum oxide (Al$_2$O$_3$), titanium oxide (TiO$_2$), zirconium oxide (ZrO$_2$) and hafnium oxide (HfO$_2$) to obtain an ALD-coated substrate, the ALD deposited metal oxide layer being in direct contact with the diffusive internal extraction layer,
   (c) washing the resulting ALD-coated substrate,
   (d) depositing by sputtering a SiO$_x$N$_y$ layer on the ALD-coated washed substrate so that the sputter-deposited SiO$_x$N$_y$ layer is in direct contact with the ALD-deposited metal oxide layer,
   (e) depositing a transparent conductive oxide layer in direct contact with the SiO$_x$N$_y$ layer, and
   (f) depositing a metal layer onto the transparent conductive oxide layer.

11. The method according to claim 10, further comprising the additional step of patterning the transparent conductive oxide layer, and the metal layer, by photolithography and acid wet etching.

12. The method according to claim 10, wherein the washing step comprises immersion of the ALD-coated substrate in a detergent solution, rinsing with water and drying.

13. The method according to claim 12, wherein the washing step comprises exposing the ALD-coated substrate to ultrasound, during the immersion in detergent solution and during rinsing with water.

14. A layered structure suitable as a support for an organic light emitting device, said layered structure comprising:
   a light-transmissive glass substrate,
   a diffusive internal extraction layer with an outer layer made of a glass containing at least 30 weight % of Bi$_2$O$_3$, formed on one side of the light-transmissive glass substrate,
   an acid-resistant barrier layer formed on the diffusive internal extraction layer, said acid-resistant barrier layer consisting of an
      Atomic Layer Deposition (ALD) deposited metal oxide layer, the metal oxide being selected from the group consisting of aluminum oxide (Al$_2$O$_3$), titanium oxide (TiO$_2$), zirconium oxide (ZrO$_2$) and hafnium oxide (HfO$_2$), in direct contact with the diffusive internal extraction layer, and
      a sputter-deposited SiO$_x$N$_y$ layer in direct contact with the ALD-deposited metal oxide layer, and
   a transparent electrode layer on the acid-resistant barrier layer, the transparent electrode layer being provided in direct contact with the sputter-deposited SiO$_x$N$_y$ layer,
   wherein the transparent electrode layer comprises a transparent conductive oxide layer and a metal layer in contact with the transparent conductive oxide layer.

* * * * *